(12) United States Patent
Nguyen et al.

(10) Patent No.: US 7,649,751 B2
(45) Date of Patent: Jan. 19, 2010

(54) APPARATUS FOR INEXPENSIVE MEZZANINE-TYPE CARD BOARD-TO-BOARD CONNECTOR BLIND MATE ALIGNMENT SYSTEM USING PRINTED CIRCUIT BOARD MATERIAL

(75) Inventors: John D. Nguyen, Houston, TX (US); Jon Kolas, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 261 days.

(21) Appl. No.: 11/821,618

(22) Filed: Jun. 25, 2007

(65) Prior Publication Data

US 2008/0293265 A1 Nov. 27, 2008

Related U.S. Application Data

(60) Provisional application No. 60/931,812, filed on May 25, 2007.

(51) Int. Cl.
*H05K 7/14* (2006.01)
*H05K 7/18* (2006.01)

(52) U.S. Cl. .................. 361/802; 361/800; 361/752
(58) Field of Classification Search ......... 361/802–803, 361/790, 797, 752, 800, 600, 679; 312/223; 439/55, 59, 65
See application file for complete search history.

(56) References Cited

U.S. PATENT DOCUMENTS

| | | | |
|---|---|---|---|
| 5,583,749 A | 12/1996 | Tredennick | |
| 5,715,139 A * | 2/1998 | Nakajima | ............... 361/679.55 |
| 6,313,984 B1 * | 11/2001 | Furay | .................... 361/679.31 |
| 6,721,188 B1 * | 4/2004 | Jarvis et al. | ................. 361/760 |
| 6,768,642 B2 | 7/2004 | Hines | |
| 6,805,560 B1 | 10/2004 | Budny | |
| 6,935,868 B1 | 8/2005 | Campini | |
| 2002/0094706 A1 * | 7/2002 | Britton et al. | ................. 439/74 |
| 2002/0122296 A1 | 9/2002 | Stone | |
| 2006/0221590 A1 | 10/2006 | Campini | |

* cited by examiner

*Primary Examiner*—Hung S Bui

(57) ABSTRACT

An alignment system for a mezzanine-type printed circuit board is provided. The alignment system includes tab portions formed from the insulating material of the printed circuit board, in which the tab portions engage receptacles and limit movement of the printed circuit board.

21 Claims, 5 Drawing Sheets

APPARATUS FOR INEXPENSIVE MEZZANINE-TYPE CARD BOARD-TO-BOARD CONNECTOR BLIND MATE ALIGNMENT SYSTEM USING PRINTED CIRCUIT BOARD MATERIAL

CROSS-REFERENCE TO RELATED APPLICATIONS

This application claims Priority to Provisional Application Ser. No. 60/931,812, filed on May 25, 2007.

BACKGROUND

This section is intended to introduce the reader to various aspects of art, which may be related to various aspects of the present invention that are described or claimed below. This discussion is believed to be helpful in providing the reader with background information to facilitate a better understanding of the various aspects of the present invention. Accordingly, it should be understood that these statements are to be read in this light, and not as admissions of prior art.

Computer servers are used by a wide array of users in various configurations. Server systems often comprise multiple server blades housed in a chassis and/or in standard rack mount. As processing needs and computing performance have increased, server blades have become more powerful while being reduced in size. Thus, chassis and rack mount systems are capable of enclosing an increasing number of these small form factor server blades that deliver an increasing amount of performance. While the server blades are intended to be fully functional computer servers, sometimes it is desirable to add functionality or interfaces to a server blade through the use of expansion cards, such as peripheral circuit interconnect (PCI) cards. Conventional expansion cards, in which the card inserts perpendicular to the system board of the server, are usually not feasible in a server blade in which the chassis height is much smaller than a standard rack server. Such expansion cards for blade servers typically have a mezzanine-type design, in which the expansion card is inserted or installed parallel to the system board of the server. The installation and alignment of such mezzanine-type expansion cards introduces a number of design challenges and considerations.

DETAILED DESCRIPTION OF SPECIFIC EMBODIMENTS

One or more exemplary embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in greater detail below, one or more embodiments of the present techniques provide a novel alignment system for proper alignment of a mezzanine-type card when installing and mating to a system board. In one embodiment, alignment tabs formed from printed circuit board materials are inserted into receptacles mounted to the chassis of a server. The alignment system allows movement of the mezzanine-type card in a direction perpendicular to the system board for installation and removal of the card. The alignment system limits movement of the mezzanine-type card in directions parallel to the system board. Upon reading the following description, it will be apparent that the disclosed alignment techniques may be generally used in any type of space-constrained computer system, including blade servers and other servers, and may be particularly useful for installation and mating of boards wherein the mating features are hidden from view. As the alignment system utilizes existing printed circuit board material, implementation in various computer systems or expansion cards adds minimal inventory requirements and material costs for device manufacturers.

Figure 1:
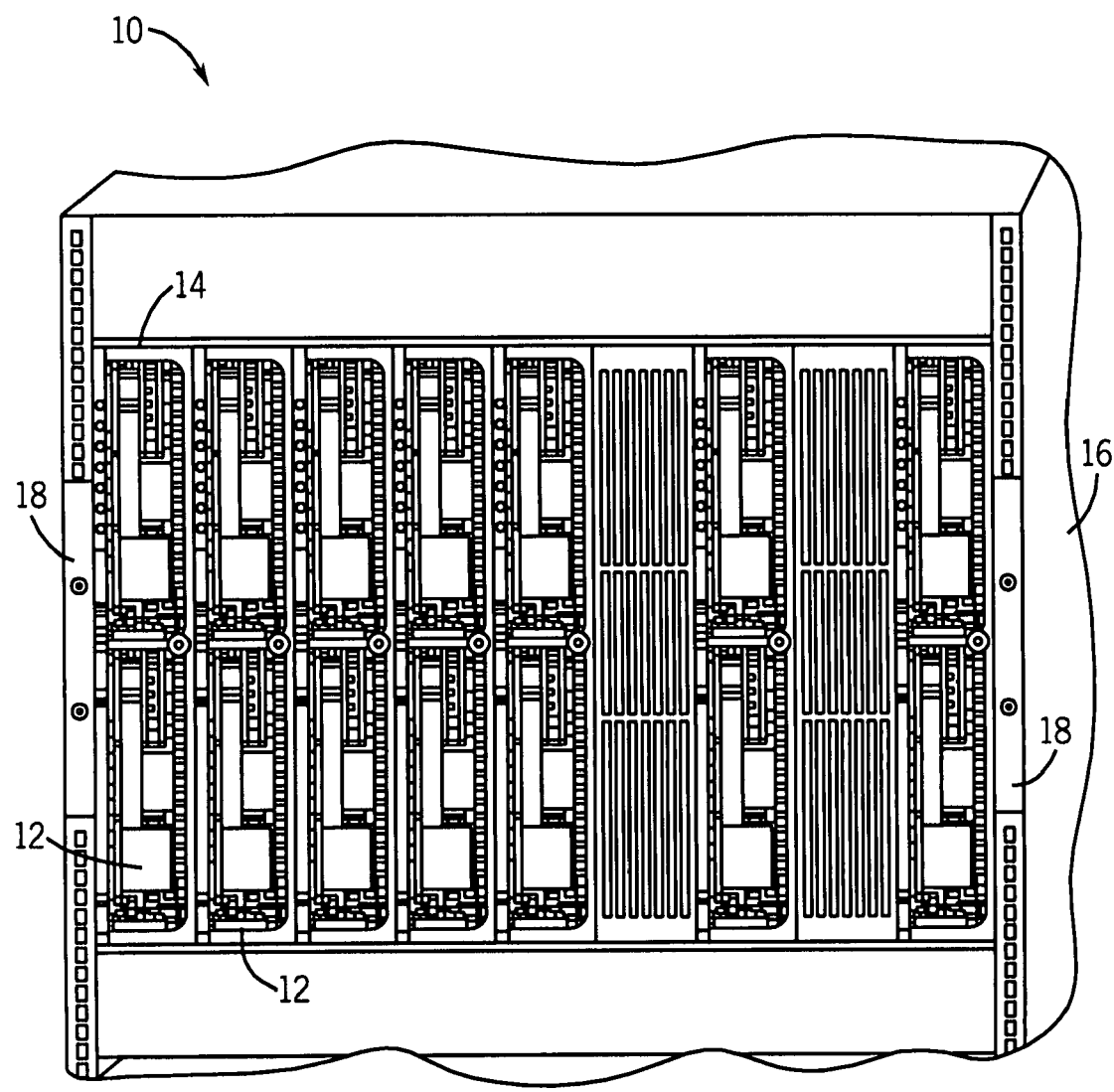
FIG. 1 is a perspective view illustrating a rack mount system having a plurality of modular server blades in accordance with an embodiment of the present technique.

Turing now to the figures, an exemplary rack mount system 10 is illustrated in FIG. 1. In the exemplary embodiment, the rack mount system 10 includes a number of computer servers 12 disposed within a chassis or enclosure 14. The chassis 14 is disposed in a rack structure or housing 16 and mounted thereto via mounting brackets 18. The servers 12 are modular, in that additional components may be externally mounted to servers 12 to convert or upgrade the servers 12. As will be appreciated, other components disposed in the rack structure 16 may include additional computer servers, power supplies, operator interfaces, and the like. It should also be noted that the rack structure 16 may have any number and configuration of rack mount receptacles having supports, such as manual or automatic rail mechanisms that support the servers 12, the chassis 14, or various other components (not shown). It should be noted that, although the exemplary servers 12 are illustrated as blade servers, the disclosed techniques are generally applicable to electronic devices including non-blade computer servers.

A server 12 may include a number of configurations to provide various functions in the system 10. Internally, a server 12 may include a printed circuit assembly (PCA) including a system board, hard disk drives, volatile or non-volatile memory devices, processors and controllers. Thus, the servers 12 provide processing and computational services and capabilities in a high density arrangement in the rack structure 16. For a server 12 to perform these tasks within a rack mount system 10, interface signals and power may be delivered to the server 12. Power may include a 12V or −48V power provided to the server 12 from a power supply located in the chassis 14 or rack structure 16, for example. Interface signals may include data transmitted from a user on a system network, or data transmitted between servers 12.

Each server 12 may have the ability to accept any number of expansion cards to add functionality or interfaces to the server 12. The added interfaces may provide for connection to the rack structure 16 or other servers 12 in the system. Expansion cards may be installed into a server 12 during assembly, before installation into the rack structure 16, or such expansion cards may be added to a server 12 after assembly if new functionality or interfaces are required. In this manner, expansion cards allow a server 12 to utilize new technology and interfaces without replacement of the server 12. The expansion cards may be printed circuit boards (PCBs) of insulating material and conductive traces. The expansion card PCBs may have one or more controllers, microchips, memory chips, connectors, or other integrated circuits or electrical components mounted to the PCB.

Because the exemplary servers 12 shown are blade servers with limited chassis heights, the expansion cards used in the exemplary embodiment are mezzanine-type cards that install parallel to the system board of the server 12. As used herein, a "mezzanine-type card" refers to an expansion card that is coupled directly to another board, such as a system board, such that the card is parallel to the board. The expansion cards may include I/O cards such as hard drive backplanes and/or network cards that add Gigabit Ethernet, Fiberchannel, Infiniband, or any other networking technology. Further, the expansion card may be a mezzanine card manufactured to the Institute of Electrical and Electronics Engineers P1386.1 standard.

Figure 2:
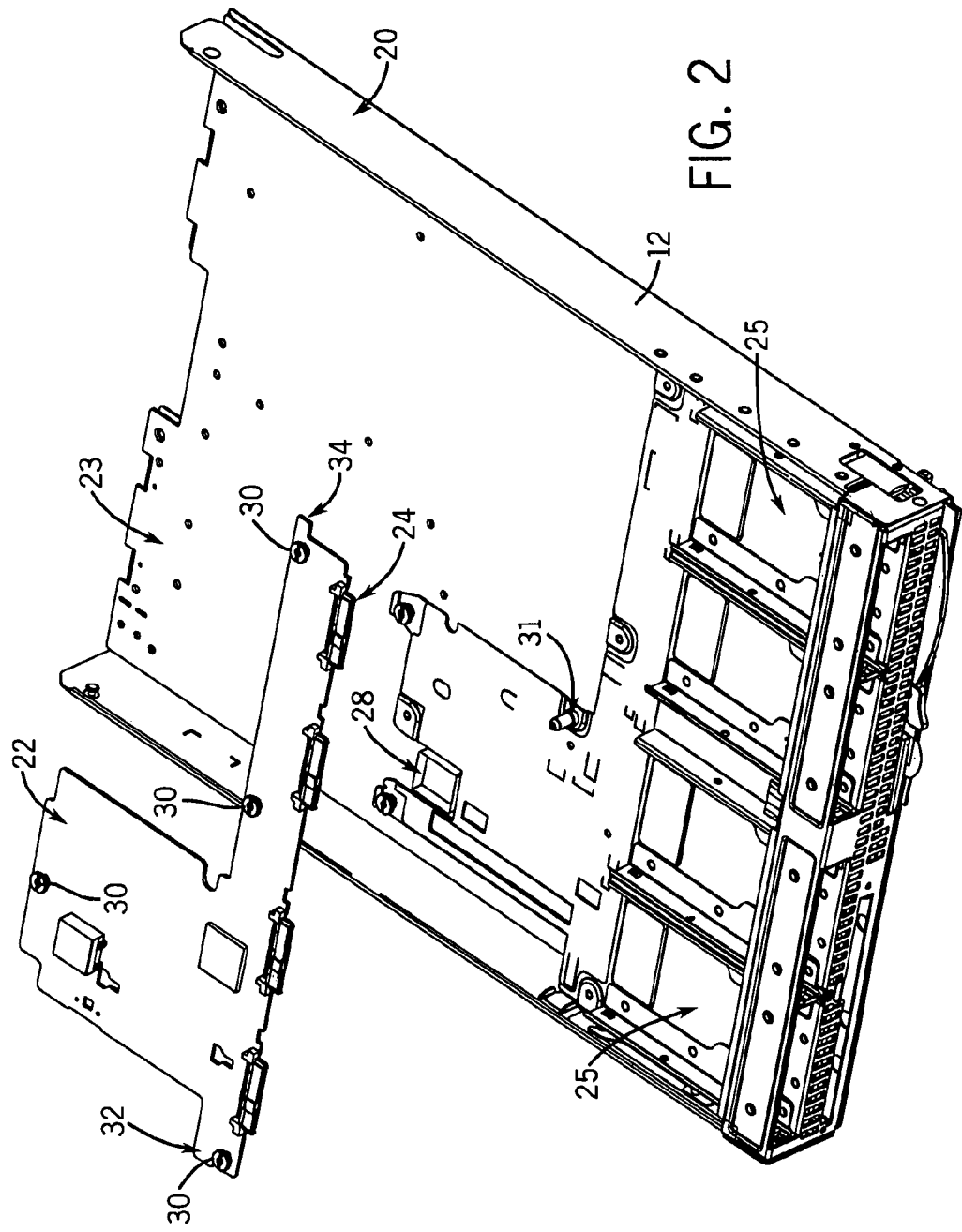
FIG. 2 is a perspective view of a server blade with a mezzanine-type card ready for insertion blades in accordance with an embodiment of the present technique.

Turning now to FIG. 2, a perspective view of an exemplary blade server 12 having a chassis 20 with a mezzanine-type card 22 ready for insertion is depicted. In this exemplary embodiment the mezzanine-type card 22 is a hard drive backplane that provides connections 24 for additional hard drives installed in drive bays 25 of server 12. The mezzanine-type card 22 is electrically coupled to the system board 23 of the server 12 through a connector on the underside of the card 22 (not shown) and the connector 28 mounted to the system board 23. The mezzanine-type card 22 may be mechanically secured to the system board 23 and the chassis 20 through the use of screws 30 shown at the corners and edges of the card 22. For proper mating of the mezzanine-type card 22 to the system board 23, the connector 28 should align with the corresponding connector on the underside of the card 22, and the screws 30 should align with corresponding holes on the system board 23 and the chassis 20. Additional alignment support may be provided by a protrusion 31 extending from the system board 23 through a hole or notch in the card 22. Any number of screws, holes, and protrusions may be provided to aid in aligning the card 22 to the system board 23.

In addition to the conventional features of the card 22 and the system board 23 described above, and in accordance with the embodiments of the invention, the card 22 also includes alignment tabs 32 and 34. The alignment tabs 32 and 34 are molded from the insulating material of the PCB of the card 22. The addition of the alignment tabs 32 and 34 to the card 22 may be accomplished during manufacture of the PCB and the card 22 and may advantageously utilize existing PCB material. The alignment tabs 32 and 34 and corresponding slots or receptacles located on the chassis 20 provide assistance during installation of the card, especially when "blind mating" the card 22 to the system board 23 is required because the connector on the underside of the card 22 is hidden from view. Installing the card 22 to the system board 23 also hides the connector 28 on the system board 23 from view, further complicating the installation process. Because the alignment tabs 32 and 34 may be manufactured out of existing PCB material, addition of the tabs 32 and 34 to the mezzanine-type card 22 is relatively inexpensive and easy to add to the manufacturing process.

Removal of the card 22 is accomplished in a similar manner to installation. To properly remove the card 22 from the system board 23 and avoid damage to the connectors that electrically couple the card 22 to the system board 23, the card 22 should be kept in proper alignment during removal. During removal, movement of the card 22 in a direction parallel to the system board 23, such as toward the back, front, or sides of the chassis 20, without proper detachment from connector 28, can result in damage to the connector 28 or the card 22. Again, because the connector 28 on the system board 23 and the connector on the card 22 are hidden from view, the direction of removal of the card 22 may not be readily apparent when viewing the card 22 installed in the server 12. The alignment tabs 32 and 34 assist in removal of the card 22 by preventing removal of the card 22 in the wrong directions, i.e. parallel to the system board 23, thereby assisting to prevent damage to the card 22 and/or the connector 28 on the system board 23 and the connector on the underside of the card 22. As discussed above, addition of the alignment tabs 32 and 34 to the card 22 is relatively inexpensive and simple to add to the manufacturing process because the alignment tabs 32 and 34 are formed from the existing PCB material of the card 22.

Figure 3:
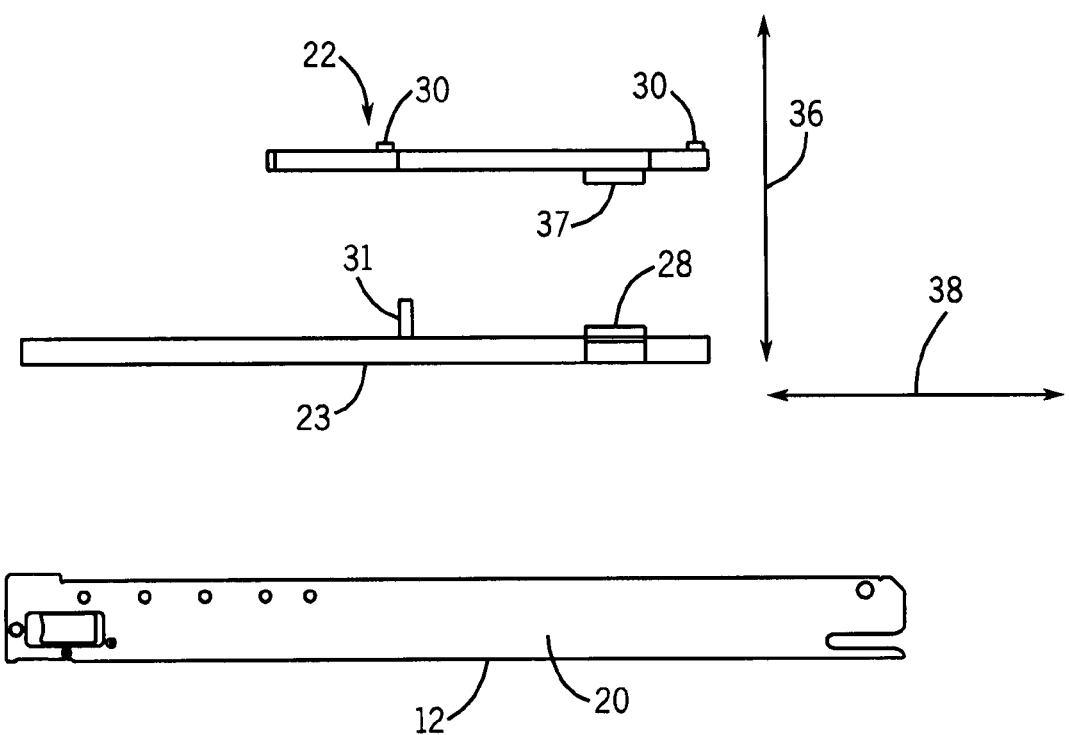
FIG. 3 is an exploded side view of a server blade with a mezzanine-type card blades in accordance with an embodiment of the present technique.

FIG. 3 shows an exploded side view of the server 12, depicting the mezzanine-type card 22, the system board 23, and the chassis 20. Lines 36 and 38 illustrate respective proper and improper installation and removal directions of the card 22. During installation or removal of the card 22, the card 22 should be inserted or removed in a direction perpendicular to the system board 23 along the directions indicated by line 36. To ensure proper connection to the system board 23, the connector 37 on the card 22 should align with and mate to the connector 28 on the system board 23. Any attempts to move or remove the card 22 in directions parallel to the system board 23, such as in the directions illustrated by line 36, may result in damage to the connector 28 or the connector 37, and/or damage to the card 22 itself. Installation, movement, or removal of the card 22 is further complicated because the connectors 28 and 37 will be hidden from view during installation or removal, and the proper directions of movement of the card 22 may not be apparent when the connectors 28 and 37 are hidden. Additional alignment supports, such as the protrusion 31 from the system board 23, may also be provided, and proper alignment during installation or removal of the card 22 ensures additional supports are also properly aligned in addition to the connectors 28 and 37. As explained further below, the present invention limits movement of the card 22 along the direction illustrated by line 38, but allows movement along the direction indicated by line 36, that is in a direction perpendicular to the system board 23 to ensure proper installation and removal of the card 22. Accordingly, the tabs 32 and 34 advantageously prevent damage to numerous components when blind mating the connector 37 of the card 22 to the connector 28 on the system board 23.

Figure 4:
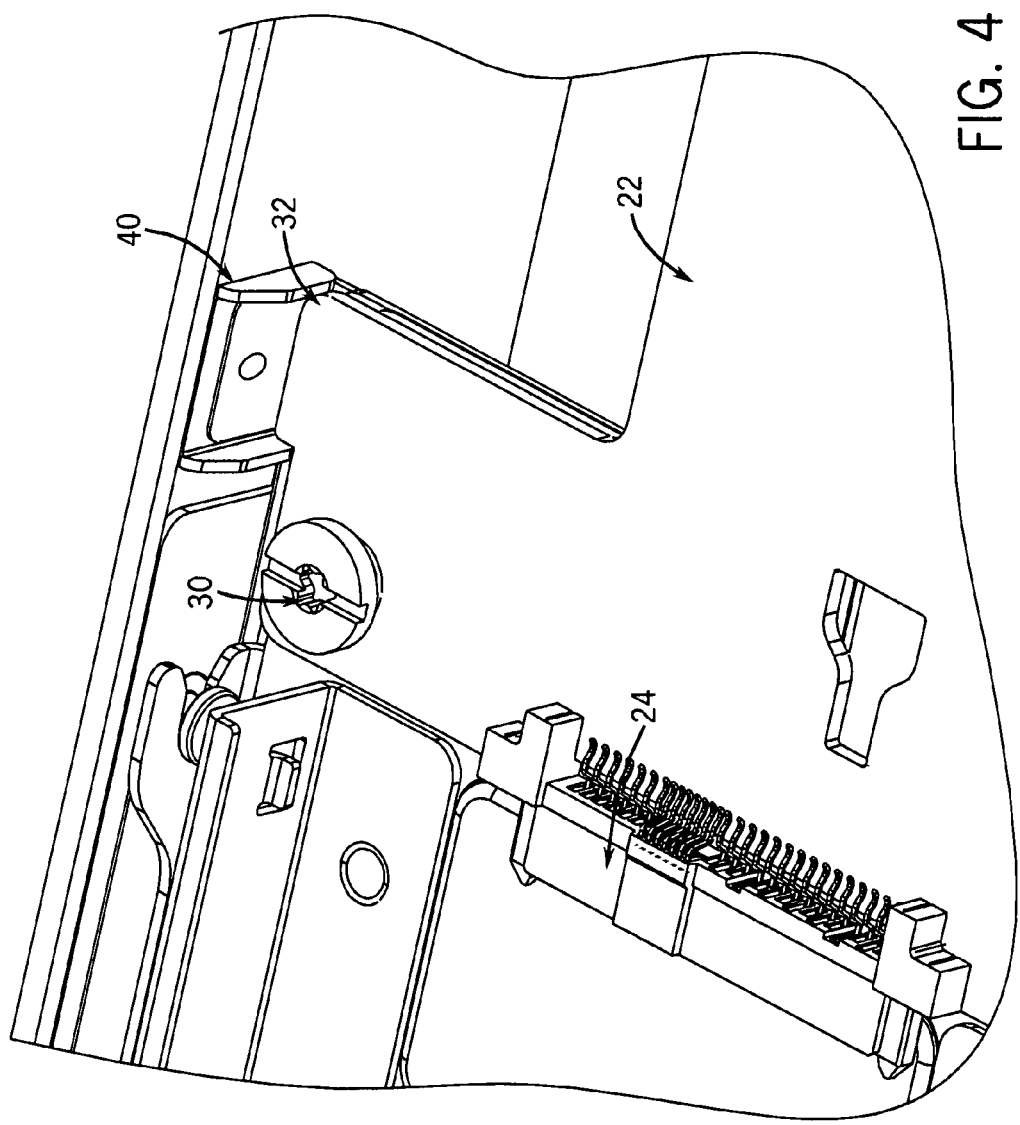
FIG. 4 is a more detailed perspective view of an alignment tab on the left edge of an installed mezzanine-type card in accordance with an embodiment of the present technique.
Figure 5:
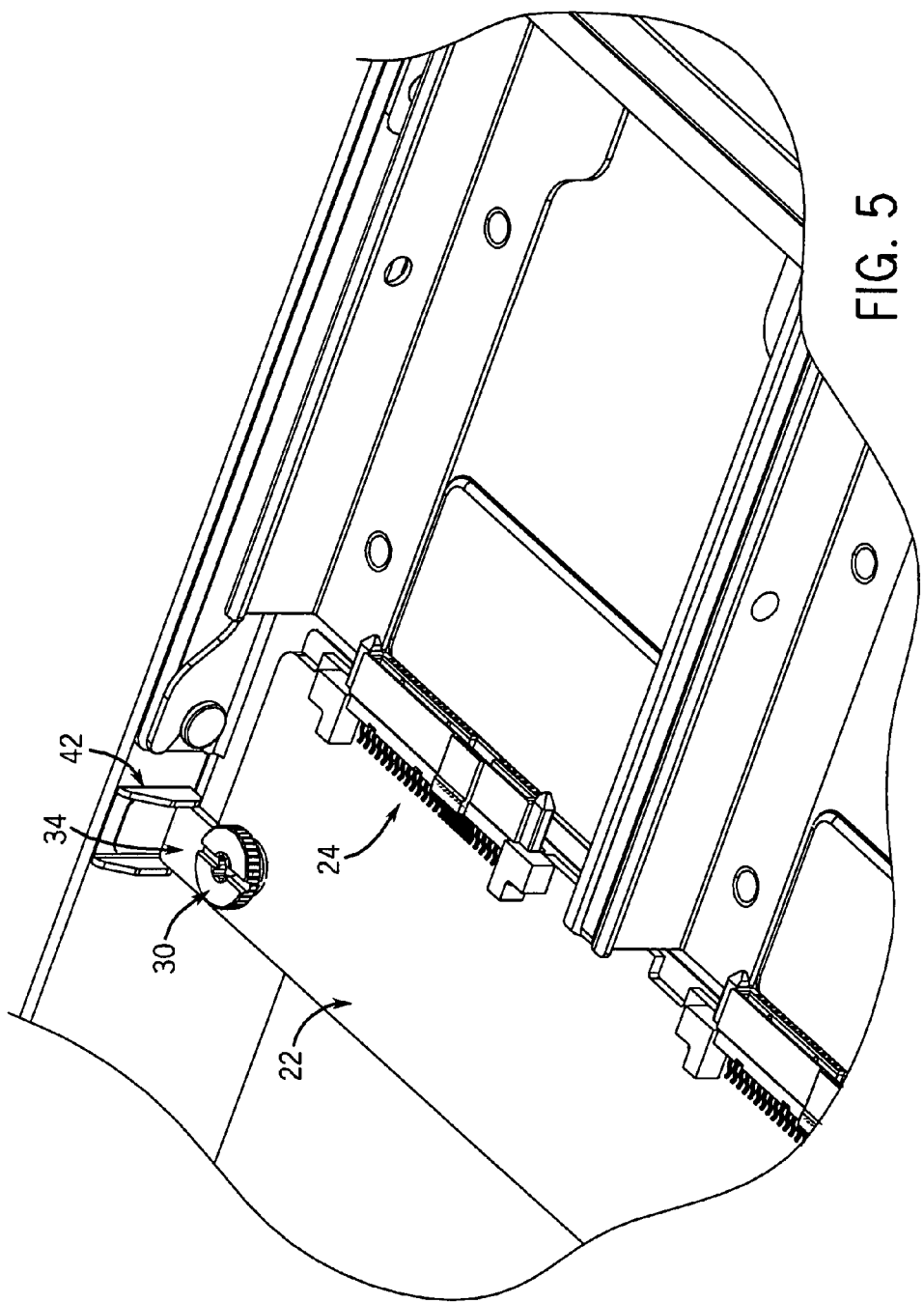
FIG. 5 is a more detailed perspective view of an alignment tab on the right edge of an installed mezzanine-type card in accordance with an embodiment of the present technique.

FIGS. 4 and 5 illustrate more detailed views of the alignment tabs 32 and 34 and the surrounding components in accordance with embodiments of the present invention. FIG. 4 depicts the left edge of the card 22 and FIG. 5 depicts the right edge of the card 22 when installed in the server 12 and connected to the system board 23. In FIG. 4, the alignment tab 32 on the left edge of the card 22 engages the receptacle 40 to restrict movement of the card 22 in directions parallel to the system board 23. Similarly, in FIG. 5, the alignment tab 34 on the right edge of the card 22 engages the receptacle 42 to provide the same function. The receptacles 40 and 42 may be formed as a part of the chassis 12, and may be a slot design or any alternative design that can be configured to receive a tab such as the alignment tabs 32 and 34. Alternatively, the receptacles 40 and 42 may be formed separately and mounted to the chassis 12, either as individual pieces or as a part of guides or rails mounted to the chassis 12. The receptacles 40 and 42 may be formed from metal, plastic, or any other suitable material. Further, the receptacles 40 and 42 may be removable and exchangeable to accommodate different sizes or number of alignment tabs or expansion cards.

As discussed above, the alignment tabs 32 and 34 are formed from the PCB material of the card 22. Proper installation of the card 22 is enabled when the alignment tabs 32 and 34 are aligned with the receptacles 40 and 42 respectively. The engagement of the alignment tabs 32 and 34 with the receptacles 40 and 42 requires the card 22 to be positioned such that the connector 37 on the card 22 is aligned with the connector 28 on the system board 23. As a further result, the screws 30 are aligned with corresponding holes in the system board 23, and the protrusion 31 is aligned with a corresponding hole or notch in the card 22. After the card 22 is properly installed and mated to the system board 32, the engagement of the alignment tabs 32 and 34 with the receptacles 40 and 42 respectively advantageously prevent movement of the card 22 in directions parallel to the system board 23. For example, the engagement restricts movement of the card 22 towards the front or back of the chassis 20. The restriction in movement prevents improper removal of the card 22 in a direction parallel to the system board 23 and/or improper bending or flexing of the card 22 as well.

While the present description has focused on the connection of one expansion card, other configurations are also envisaged. For instance, in one embodiment, the server 12 may have multiple connectors disposed on the system board 23 to facilitate connection of a plurality of expansion cards, in which each card uses the alignment system described herein. In some embodiments, the card may have one, two, or multiple alignment tabs that engage corresponding receptacles on the chassis 12.

What is claimed is:

1. An alignment system for a mezzanine-type printed circuit board, comprising:
   a printed circuit board comprising an insulating material and conductive traces and having a first end and a second end opposing the first end;
   a first tab extending from the first end of the printed circuit board, wherein the first tab is formed from the insulating material;
   a first receptacle receiving the first tab therein;
   a second tab extending from the second end of the printed circuit board, wherein the second tab is formed from the insulating material;
   wherein movement of the printed circuit board is limited by engagement between the first tab and the first receptacle and between the second tab and the second receptacle.

2. The system of claim 1, comprising a system board wherein the printed circuit board is arranged parallel to the system board.

3. The system of claim 2, wherein the receptacle is configured to limit movement of the printed circuit board in a direction parallel to the system board.

4. The system of claim 2, wherein the receptacle is configured to allow movement of the printed circuit board in a direction perpendicular to the system board.

5. The system of claim 2, wherein the system board has a protrusion to align the printed circuit board.

6. The system of claim 1, wherein the printed circuit board comprises a mezzanine card.

7. The system of claim 1, wherein the printed circuit board comprises a hard drive backplane.

8. The system of claim 1, comprising a chassis, wherein the receptacle is secured to the chassis.

9. A computer, comprising:
   a chassis;
   a system board coupled to the chassis;
   a printed circuit board comprising an insulating material and conductive traces;
   a receptacle mounted to the chassis, the receptacle comprising a first wall, a second wall substantially parallel to the first wall, and a third wall extending between the first and second walls; and
   a tab extending from the printed circuit board and formed from the insulating material, the tab inserted within the receptacle, whereby movement of the printed circuit board is limited by engagement between the tab and the first, second, and third walls of the receptacle.

10. The computer of claim 9, wherein the printed circuit board is arranged parallel to the system board.

11. The computer of claim 9, wherein the movement of the printed circuit board is limited in a direction parallel to the system board.

12. The computer of claim 9, wherein the movement of the printed circuit board is in at least a direction perpendicular to the system board.

13. The computer of claim 9, wherein the printed circuit board comprises a mezzanine card.

14. The computer of claim 9, wherein the printed circuit board comprises a hard drive backplane.

15. The computer of claim 9, wherein the system board has a protrusion to further align the printed circuit board.

16. The computer of claim 9, wherein the system board comprises a connector electrically coupling the system board to the printed circuit board.

17. A method of installing a mezzanine-type printed circuit board, comprising:
   aligning the printed circuit board in a direction parallel to a system board, wherein the printed circuit board comprises insulating material and conductive traces;
   inserting a tab portion formed of the insulating material and extending from the printed circuit board into a four-sided receptacle; and
   limiting movement of the printed circuit board by engagement between the tab and the four sides of the receptacle.

18. The method of claim 17, wherein said engaging of tab with the receptacle limits movement of the printed circuit board parallel to the system board.

19. The method of claim 17, wherein said engaging of the tab with the receptacle allows movement of the printed circuit board perpendicular to the system board.

20. The method of claim 17, wherein the printed circuit board comprises a mezzanine card.

21. The method of claim 17, wherein the printed circuit board comprises a hard drive backplane.

* * * * *